US012089347B2

(12) United States Patent
Kuo et al.

(10) Patent No.: US 12,089,347 B2
(45) Date of Patent: Sep. 10, 2024

(54) METHOD OF IMPROVING WIRE STRUCTURE OF CIRCUIT BOARD AND IMPROVING WIRE STRUCTURE OF CIRCUIT BOARD

(71) Applicant: UNIMICRON TECHNOLOGY CORP., Taoyuan (TW)

(72) Inventors: Chun Yi Kuo, Taoyuan (TW); Jia Hao Liang, New Taipei (TW); Ching Ku Lin, Taoyuan (TW)

(73) Assignee: UNIMICRON TECHNOLOGY CORP., Taoyuan (TW)

( * ) Notice: Subject to any disclaimer, the term of this patent is extended or adjusted under 35 U.S.C. 154(b) by 330 days.

(21) Appl. No.: 17/500,976

(22) Filed: Oct. 14, 2021

(65) Prior Publication Data

US 2023/0092278 A1    Mar. 23, 2023

(30) Foreign Application Priority Data

Sep. 23, 2021 (TW) ................................. 110135421

(51) Int. Cl.
 *H05K 1/11* (2006.01)
 *H05K 1/02* (2006.01)
 *H05K 3/46* (2006.01)
(52) U.S. Cl.
 CPC ......... *H05K 3/4611* (2013.01); *H05K 1/0298* (2013.01); *H05K 1/112* (2013.01); *H05K 1/115* (2013.01); *H05K 1/11* (2013.01)

(58) Field of Classification Search
 CPC ............... H05K 3/4611; H05K 1/0298; H05K 2201/09563; H05K 3/4652; H05K 3/108; H05K 2203/1476
 See application file for complete search history.

(56) References Cited

U.S. PATENT DOCUMENTS

| 6,717,070 B2* | 4/2004 | Watanabe | H05K 3/421 |
| | | | 174/262 |
| 8,424,202 B2* | 4/2013 | Tseng | H05K 1/0298 |
| | | | 29/830 |
| 9,572,250 B2* | 2/2017 | Lee | H05K 1/0298 |

(Continued)

FOREIGN PATENT DOCUMENTS

| JP | 2008021770 | 1/2008 |
| TW | 201618622 A | 5/2016 |
| TW | 201817293 A | 5/2018 |

*Primary Examiner* — Ishwarbhai B Patel
(74) *Attorney, Agent, or Firm* — WPAT, PC

(57) ABSTRACT

A circuit board, comprising a multi-layer circuit board, a first conductive circuit, a first circuit layer, an adhesion promoter layer, a second conductive circuit, and a second circuit layer. The multi-layer circuit board comprises an inner circuit and an opening. The opening exposes the inner circuit. The first conductive circuit is disposed in the opening and on the inner circuit. The first circuit layer is disposed on the first conductive circuit in the opening and lower than the depth of the opening. The adhesion promoter layer is disposed in the opening and on the surface of the multi-layer circuit board and connected to the first conductive circuit. The second conductive circuit is disposed on the adhesion promoter layer and on the first circuit layer in the opening. The second circuit layer is disposed on the second conductive circuit in the opening and on the second conductive circuit.

2 Claims, 13 Drawing Sheets

(56) References Cited

U.S. PATENT DOCUMENTS

| | | | |
|---|---|---|---|
| 9,875,957 B2* | 1/2018 | Shimizu | H05K 3/4644 |
| 2005/0029110 A1* | 2/2005 | Tang | H05K 3/4647 |
| | | | 205/125 |
| 2007/0158852 A1* | 7/2007 | Hsu | H05K 3/421 |
| | | | 257/781 |
| 2017/0245365 A1* | 8/2017 | Ishihara | H05K 1/115 |
| 2020/0163229 A1 | 5/2020 | Huang et al. | |
| 2020/0273794 A1 | 8/2020 | Khaderbad et al. | |

* cited by examiner

METHOD OF IMPROVING WIRE STRUCTURE OF CIRCUIT BOARD AND IMPROVING WIRE STRUCTURE OF CIRCUIT BOARD

CROSS-REFERENCE TO RELATED APPLICATIONS

This application claims the benefit of the filing date of Taiwan Patent Application No. 110135421, filed on Sep. 23, 2021, in the Taiwan Intellectual Property Office, the disclosure of which is incorporated herein in its entirety by reference.

BACKGROUND OF THE INVENTION

1. Field of the Invention

The disclosure relates to an improving method and an improving structure, and more particularly, a method of improving a wire structure of a circuit board and an improving wire structure of the circuit board.

2. Description of the Related Art

With the development of electronic product technology, communications between a user and a machine has become an increasingly important technical issue.

Refer to FIG. 3A to FIG. 3G. FIG. 3A to FIG. 3G are a schematic diagram of a conventional circuit board structure. The method of the conventional circuit board structure is as shown in FIG. 3A, providing a multi-layer circuit board 31, comprising an inner circuit 311 and a surface circuit 312; as shown in FIG. 3B, forming at least one opening 313 in the multi-layer circuit board 31; wherein the at least one opening 311 exposes a part of the inner circuit 311, the opening 311 being formed by a laser drill process; as shown in FIG. 3C, removing residual glue G in the opening 311 formed by the laser drill process and forming a conductive circuit 32 in the at least one opening 313 and on the surface circuit 312; as shown in FIG. 3D, forming a photoresist layer P on the conductive circuit 32 on the multi-layer circuit board 31; as shown in FIG. 3E, forming a circuit layer 33 on the conductive circuit 32 on the multi-layer circuit board 31 and in the at least one opening 313; as shown in FIG. 3F, removing the photoresist layer P; as shown in FIG. 3G, removing the conductive circuit 32 and the surface circuit 312 disposed at the position of the photoresist layer P on the surface of the multi-layer circuit board 31. After that, the conventional circuit board structure 3 is completed.

As mentioned above, in the conventional circuit board structure 3, since the surface circuit is formed on the surface of the multi-layer circuit board 31 in the initial step, the surface circuit is formed at the circuit layer 33 of the conventional circuit board structure 3 in the final step and becomes the bottom copper layer. In details, because the multi-layer circuit board 31 provided in the step S31 is formed by pressing a multi-layer lamination, the surface circuit 312 has a certain thickness, approximately 3 μm. On this basis, the present modified-semi-additive process (mSAP) in the next etching process will approximately etch to 7 μm with the lateral length (etching bias). That is, in the step S37, the total lateral length for removing bottom copper will approximately etch to 7 μm. The method significantly affects the capability of manufacturing the fine circuit of the circuit board. In other words, at the prerequisite, since the thickness on the surface circuit 312 has approximately 3 μm, the next etching process has to spend more etching time. Hence, the lateral etching length increase.

Refer to FIG. 3H. FIG. 3H is the partial enlargement view of the conventional circuit board structure. In the step S35, since the circuit layer 33 uses the method for the chemical solution to electroplate copper on the surface of the multi-layer circuit board 31 and in the at least one opening 313, the method cannot effectively control the height of the circuit layer 33 formed on the surface of the conventional circuit board structure 3. Therefore, the circuit of the conventional circuit board structure 3 cannot be homogeneous. For the standard of the present circuit board structure, a height difference R2 of the circuit on the surface of the circuit layer 33 should be less than 2 μm. However, the height difference R2 of the circuit on the surface of the circuit layer 33 of the conventional circuit board structure 3 is more than 2 μm.

Moreover, the aforementioned description is for single circuit in the circuit layer 33. For the circuit layer 33 of the conventional circuit board structure 3, the circuit layer 33 comprises a plurality of circuits. When the single circuit is not homogeneous, the circuit on the whole surface of the conventional circuit board structure 3 will not be homogeneous. For the standard of the present circuit board structure, the range of each circuit of the circuit layer 33 should be less than 3.5 μm. However, the range of each circuit of the circuit layer 33 of the conventional circuit board structure 3 is more than 10 μm.

Furthermore, in the step S32 for forming the opening 313, since the method for forming the opening 313 will easily generate residual glue G on the surface of the opening 313, the surface of the opening 313 cannot be smooth. Hence, in the next step S35, the circuit layer 33 formed in the opening 313 by the chemical solution to electroplate copper cannot be stably and strongly disposed in the opening 313, the bonding strength of the circuit layer 33 on the low roughness surface will be reduced, and the bonding strength between the circuit layer 33, the surface (bottom material) of the multi-layer circuit board 31, and the inner surface of the opening 313 will be affected.

Accordingly, how to provide a method of improving a wire structure of a circuit board and an improving wire structure of the circuit board to solve the problems mentioned above is an urgent subject to tackle.

SUMMARY OF THE INVENTION

In view of this, These and other objectives of the present invention will no doubt become obvious to those of ordinary skill in the art after reading the following detailed description of the preferred embodiment that is illustrated in the various figures and drawings.

In view of this, the present invention provides a method of improving a wire structure of a circuit board, comprising the following steps: providing a multi-layer circuit board, comprising an inner circuit; forming at least one opening in the multi-layer circuit board to expose a part of the inner circuit; forming the at least one opening on the surface of the multi-layer circuit board; forming a first circuit layer in the at least one opening; forming a second circuit layer on the first circuit layer in the at least one opening and on the surface of the multi-layer circuit board; wherein the second circuit layer comprises a plurality of circuits, and a height difference between each circuit protruding a surface of the at least one opening is less than a first preset value, and a circuit disposition range between the plurality of circuits on the surface of the multi-layer circuit board is less than a second preset value.

As mentioned above, the method of improving the wire structure of the circuit board and the improving wire structure of the circuit board of the present invention utilize the circuit to be filled in the opening in two stages to complete the height of the circuit in the opening, wherein the method comprises the first stage for forming the first circuit layer utilizing the chemical copper mixed by solution with the excellent capability for copper electroplating to fill the opening, and the second stage for forming the second conductive circuit by disposing the chemical copper mixed by the solution with excellent homogeneity on the first circuit layer in the opening to complete the height of the circuit in the opening. Accordingly, the present invention achieves the effects that the height difference between the plurality of circuits protruding the at least one opening is less than the first preset value, 2 μm, and the circuit disposition range between the plurality of circuits on the surface of the multi-layer circuit board is less than the second preset value, 3.5 m. Consequently, the homogeneity of the circuit layer can be promoted, the density of the circuit board can be increased and the reliability of the circuit layer can be improved. Besides, the method of improving a wire structure of a circuit board achieves the effect that the thickness of copper formed on the surface of the improving wire structure of the circuit board is less than and equal to 0.85 m. Therefore, the development for the fine circuit of the improving wire structure of the circuit board can be promoted. In addition, by the adhesion promoter layer disposed on the bottom material (the multi-layer circuit board) and in the opening, the bonding strength and the attachment ability between the second circuit layer, the bottom material, and the opening can be enhanced. Hence, the improving wire structure of the circuit board can be applied on the 5G product with low roughness in the future and the transmission rate of the 5G product can be significantly upgraded.

DETAILED DESCRIPTION OF THE INVENTION

Figure 1A:
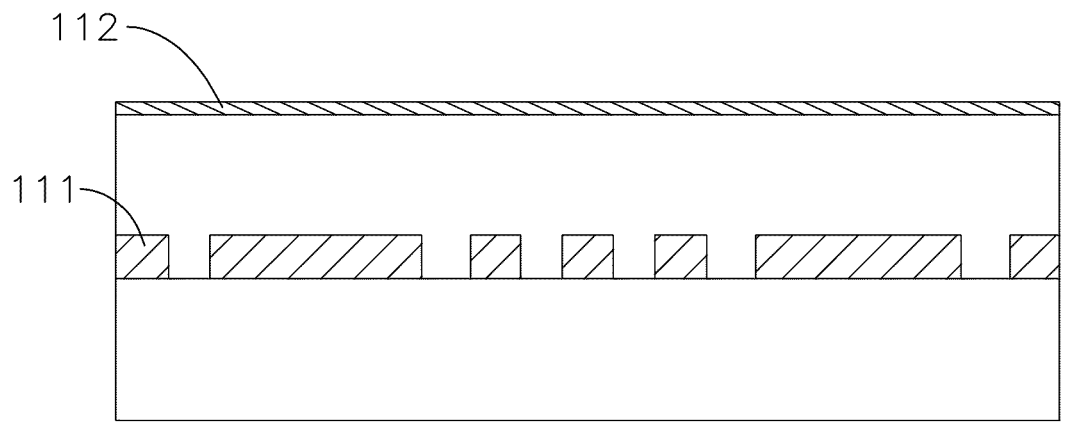
FIG. 1A to FIG. 1K are a schematic flowchart of the method of improving the wire structure of the circuit board of the present invention.
Figure 1B:
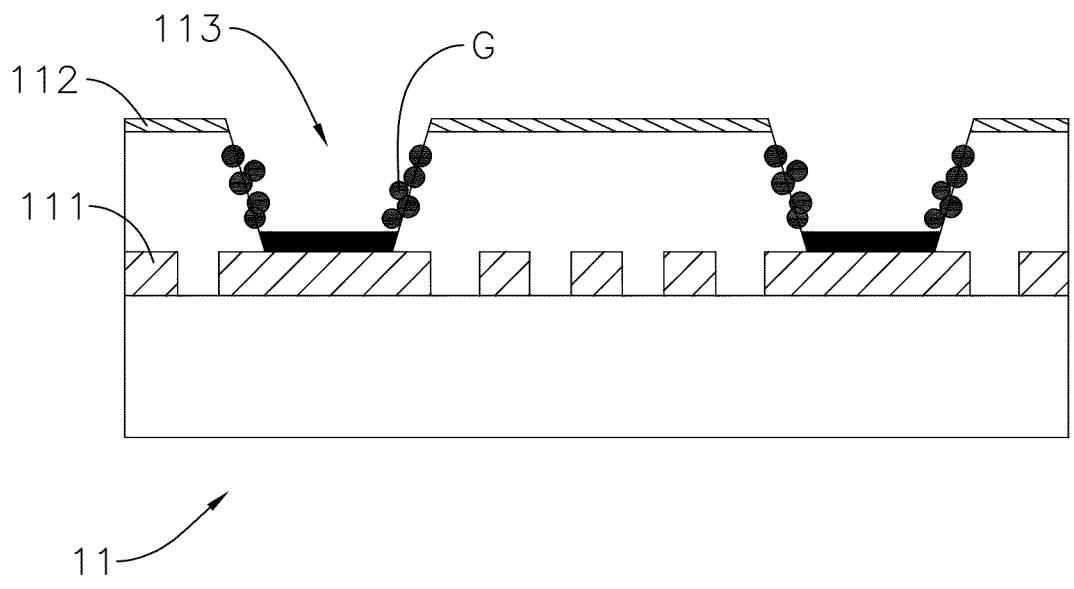
Figure 1C:
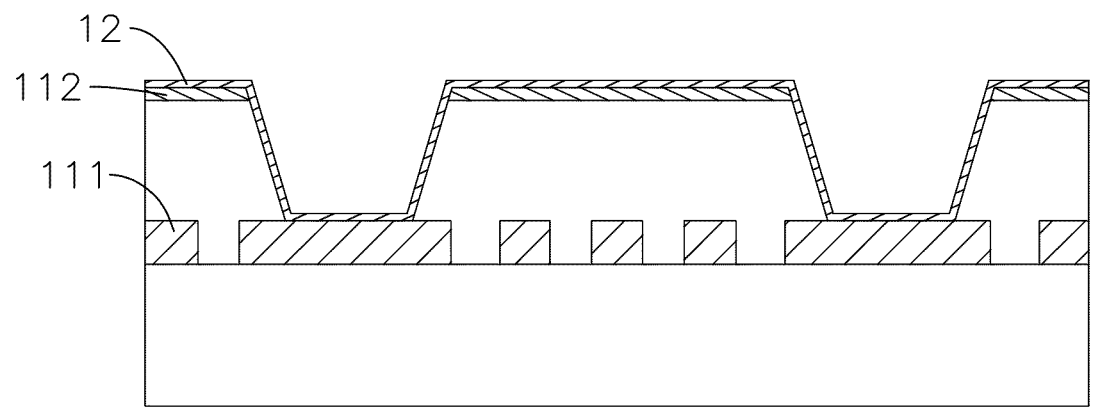
Figure 1D:
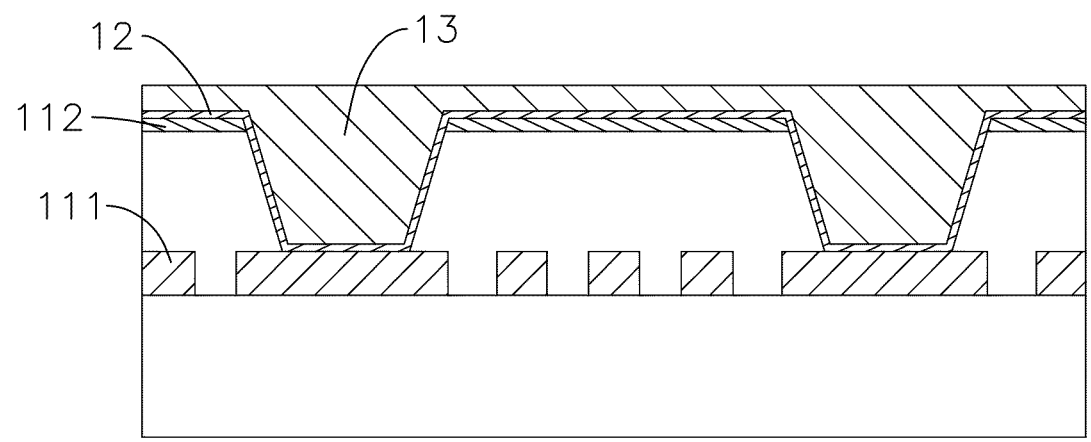
Figure 1E:
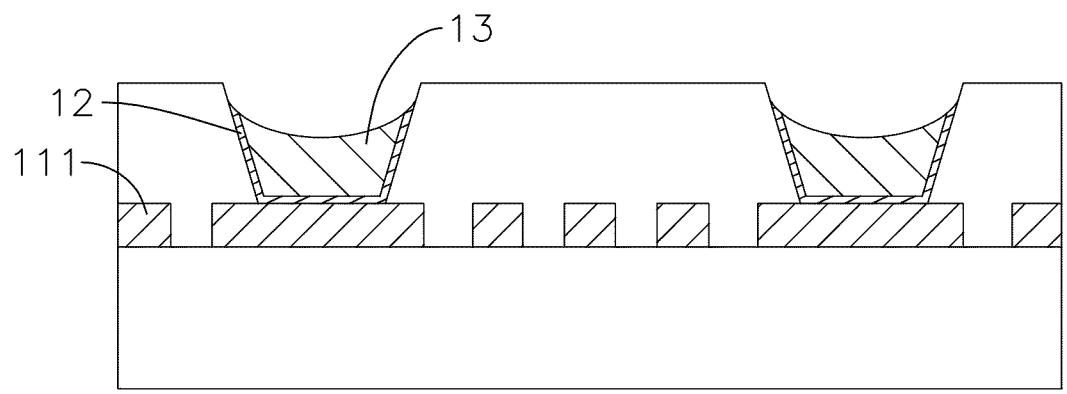
Figure 1F:
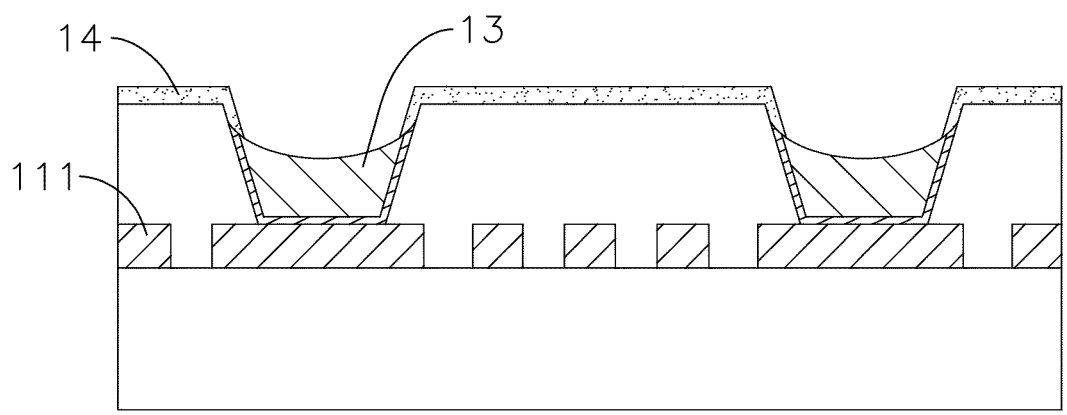
Figure 1G:
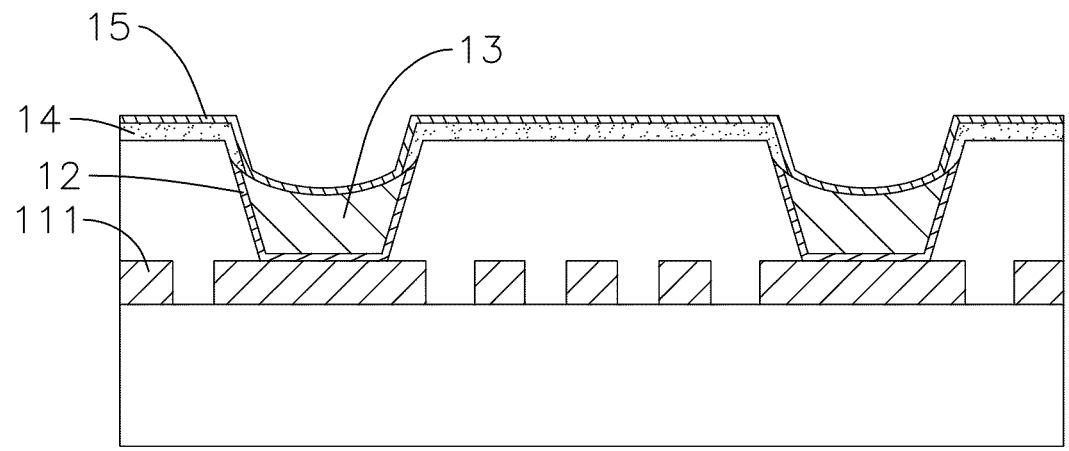
Figure 1H:
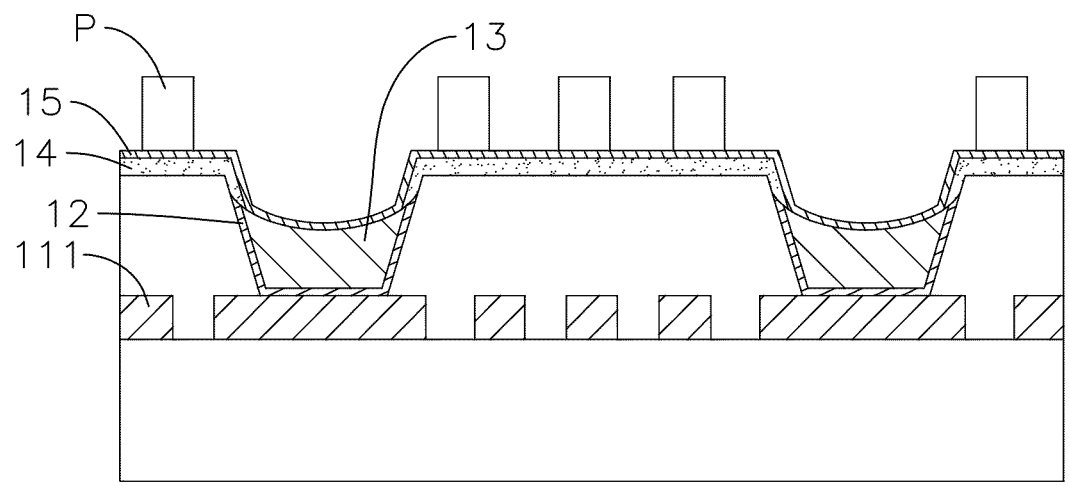
Figure 1I:
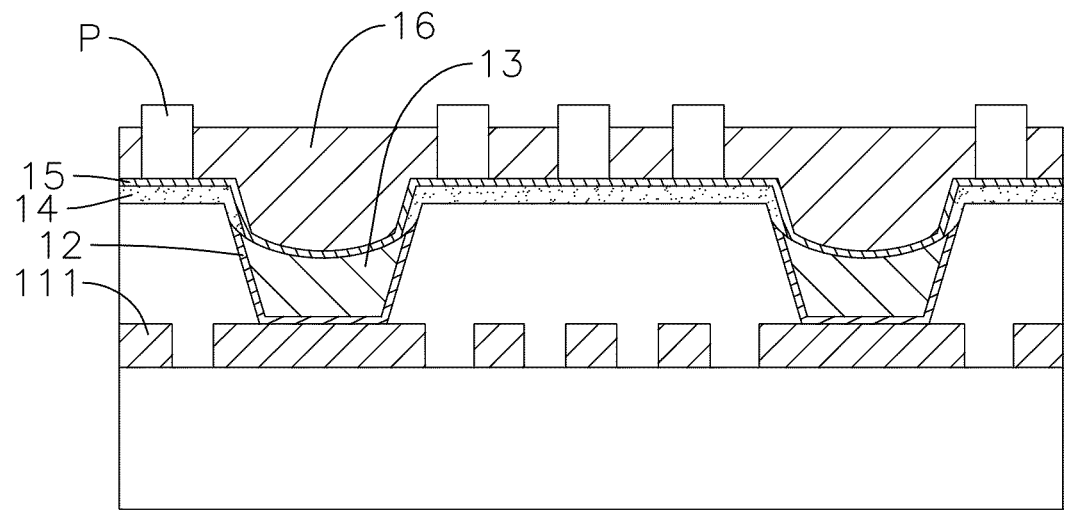
Figure 1J:
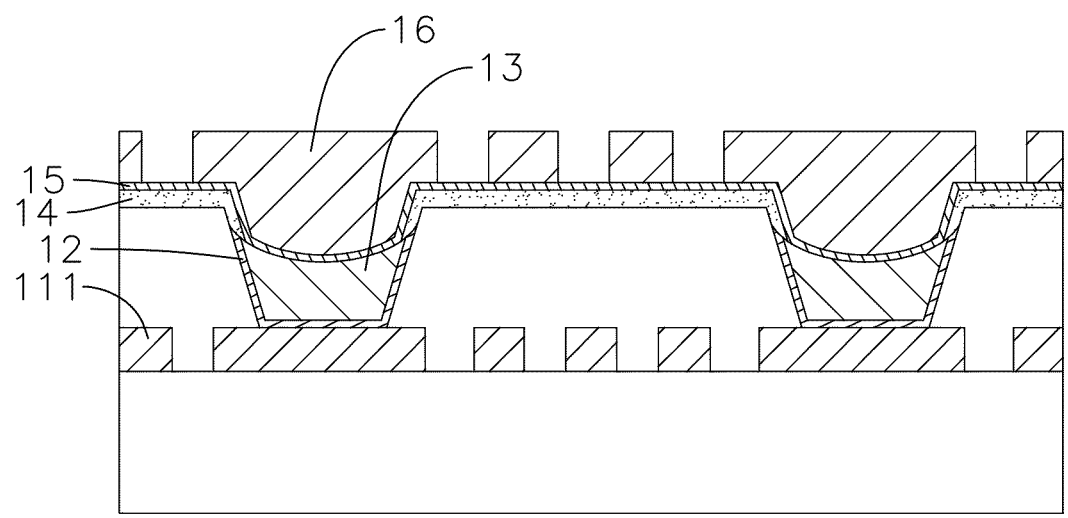
Figure 1K:
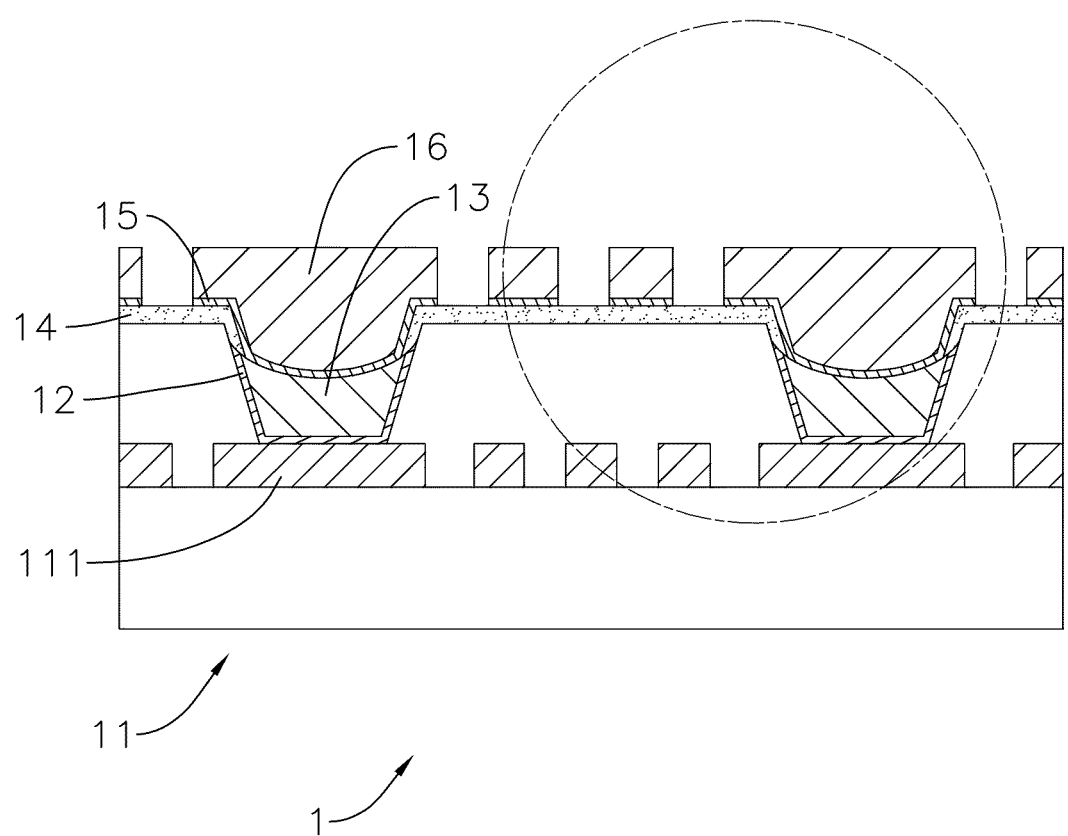

Refer to FIG. 1A to FIG. 1K. FIG. 1A to FIG. 1K are the schematic diagram of the method of improving the wire structure of the circuit board of the present invention. The method of improving the wire structure of the circuit board is as shown in FIG. 1A, providing a multi-layer circuit board 11; wherein the multi-layer circuit board comprises an inner circuit 111 and a surface circuit 112; as shown in FIG. 1B, forming at least one opening 113 in the multi-layer circuit board 11 to expose a part of the inner circuit 111; as shown in FIG. 1C, forming a first conductive circuit 12 in the at least one opening 113 and on the surface circuit 112; as shown in FIG. 1D, forming a first circuit layer 13 in the at least one opening 113 so that the first circuit layer 13 is filled in the at least one opening 113; in an embodiment of the present invention, the first circuit layer 13 being disposed on the first conductive circuit 12 with the least thickness; as shown in FIG. 1E, removing first the conductive circuit 12, the surface circuit 112 and the first circuit layer 13 on the multi-layer circuit board 11 and removing a part of the first circuit layer 13 in the at least one opening 113; as shown in FIG. 1F, forming an adhesion promoter layer 14 in the at least one opening 113 and on the surface of the multi-layer circuit board 11; as shown in FIG. 1G, forming a second conductive circuit 15 on the adhesion promoter layer 14 and on the first circuit layer 13 in the at least one opening 113; as shown in FIG. 1H, forming a photoresist layer P on the second conductive circuit 15 on the surface of the multi-layer circuit board 11; as shown in FIG. 1I, forming a second circuit layer 16 in the at least one opening 113 and on the surface of the multi-layer circuit board 11 by the photoresist layer P so that a height difference between a plurality of circuits of the second circuit layer 16 protruding from a surface of the at least one opening 113 is less than a first preset value, and so that a circuit disposition range between the plurality of circuits of the second circuit layer 16 disposed on the surface of the multi-layer circuit board 11 is less than a second preset value; as shown in FIG. 1J, removing the photoresist layer P; as shown in FIG. 1K, removing the second conductive circuit 15 disposed at the position of the photoresist layer P on the multi-layer circuit board 11. After that, the improving wire structure of the circuit board 1 is completed.

In the step S12, the method for forming the opening 113 comprises a laser drill process. After the process, the step S12 further removes residual glue Gin the opening 113 to smooth the surface inside the opening 113.

In the step S16, the adhesion promoter layer 14 contacts with the the surface of the first circuit layer 13 in the opening 113. By the adhesion promoter layer 14, the bonding strength between the second circuit layer 16 disposed on the adhesion promoter layer 14 and the surface (the material at the bottom) of the multi-layer circuit board 11 and the inner surface of the opening 113 can be enhanced. In one embodiment of the present invention, after the tension test, the tension for the loading attains to 0.03 (kgf/cm) without the adhesion promoter layer 14. In another embodiment of the present invention, after the tension test, the tension for the loading further attains to 0.2-0.3 (kgf/cm) with the adhesion promoter layer 14.

In the step S13 and the step S17, the method for forming the first conductive circuit 12 and the second conductive circuit 15 comprises the electroplating (copper) process. The thickness of electroplating is less than and equal to 0.85 μm. That is, the thickness of copper on the surface of the improving wire structure of the circuit board 1 is less than and equal to 0.85 μm.

In the step S21, the method for removing the second conductive circuit 15 comprises the etching process. Moreover, in addition to removing the second conductive circuit 15 in the vertical direction, the etching process further removes the second conductive circuit 15 in the lateral direction (etching bias). In an embodiment, the length of the second conductive circuit 15 etched in the lateral direction is less than 2 μm. In details, since the thickness of the second conductive circuit 15 is less than and equal to 0.85 μm, the length of the second conductive circuit 15 etched in the lateral direction is less than 2 μm on condition that the vertical thickness is thinner.

In the step S14, the method for forming the first circuit layer 13 utilizes the chemical copper mixed by solution with an excellent capability for copper electroplating with horizontal pulse to fill the opening.

In the step S17, the second conductive circuit 16 is formed by disposing the chemical copper mixed by the solution with excellent homogeneity on the first circuit layer 13 in the opening 113 to complete the height of the circuit in the opening 113.

Figure 1L:
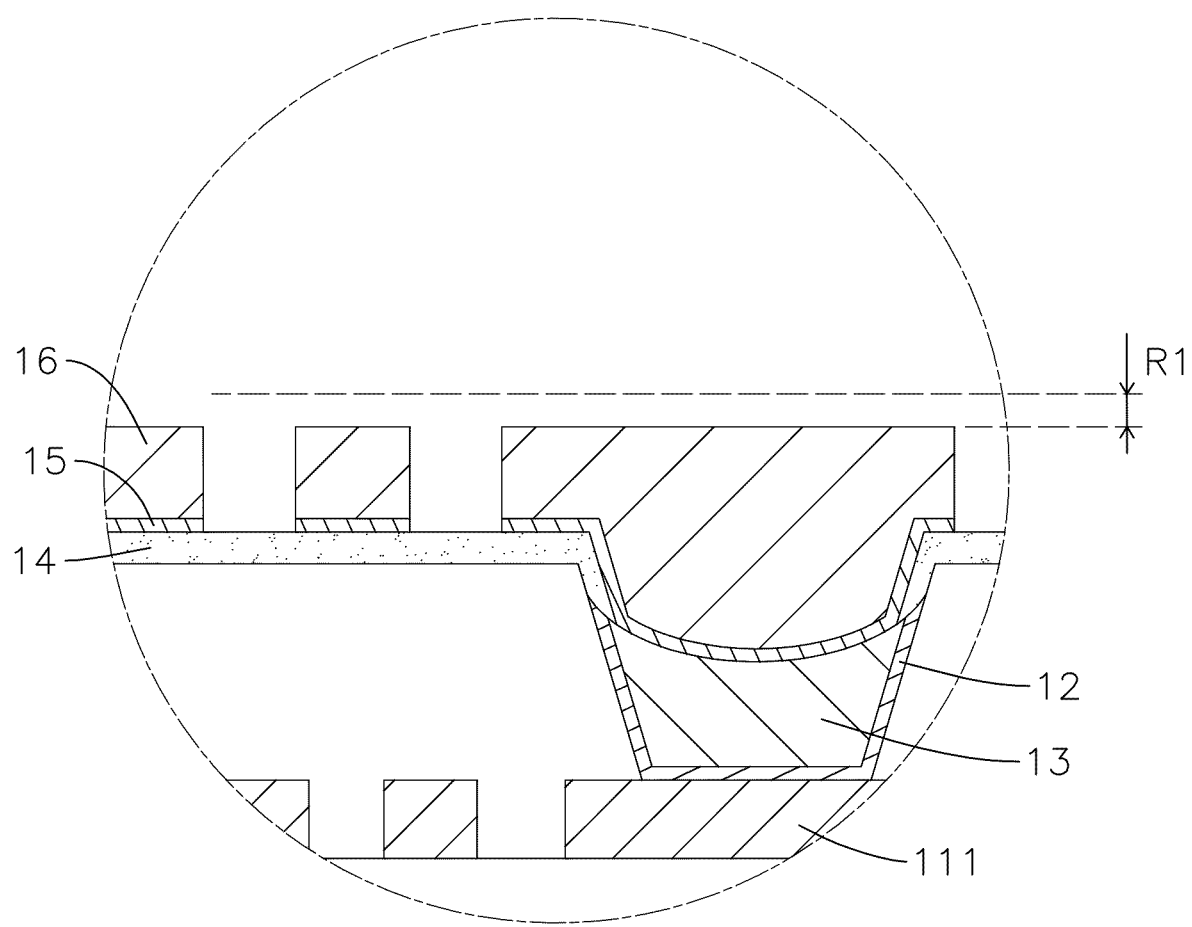
FIG. 1L is a partial enlargement view of the circuit board structure of the improving wire structure of the circuit board.

Refer to FIG. 1L. FIG. 1L is the partial enlargement view of the circuit board structure of the improving wire structure of the circuit board. According to the aforementioned method, a height difference between the surface of each circuit of the second circuit layer 16 is less than the first preset value R1, 2 μm, and a circuit disposition range between each circuit of the second circuit layer 16 on the surface of the multi-layer circuit board 11 is less than a second preset value, 3.5 μm.

Figure 2:
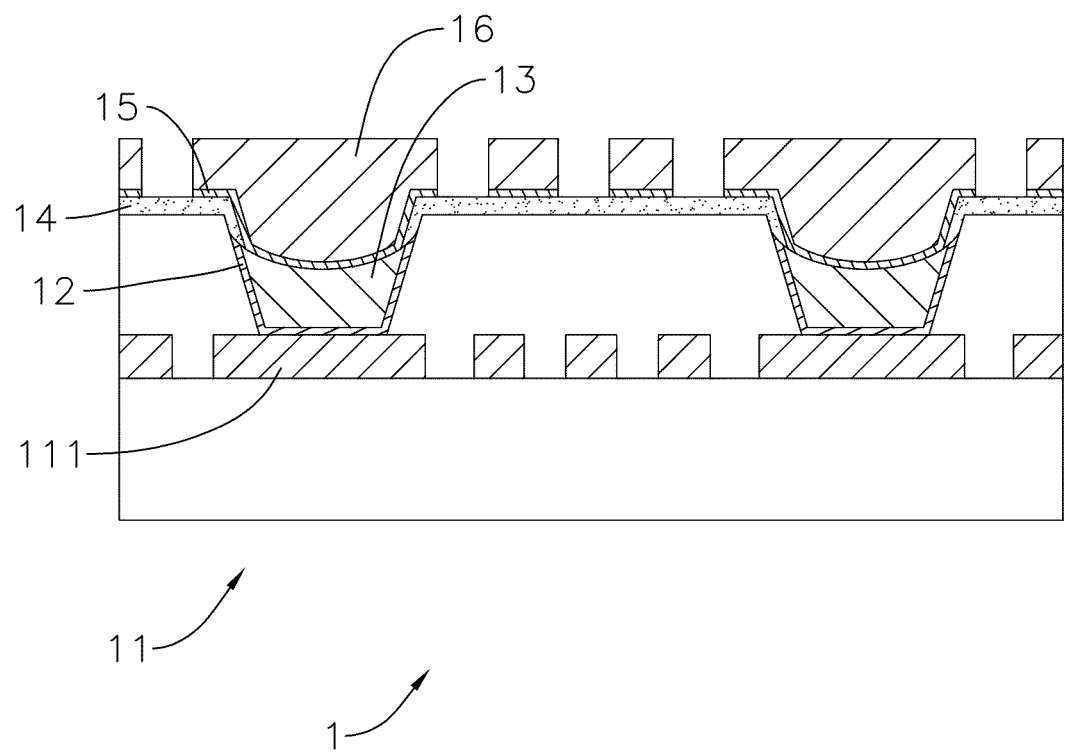
FIG. 2 is a cross sectional view of the improving wire structure of the circuit board.
Figure 3A:
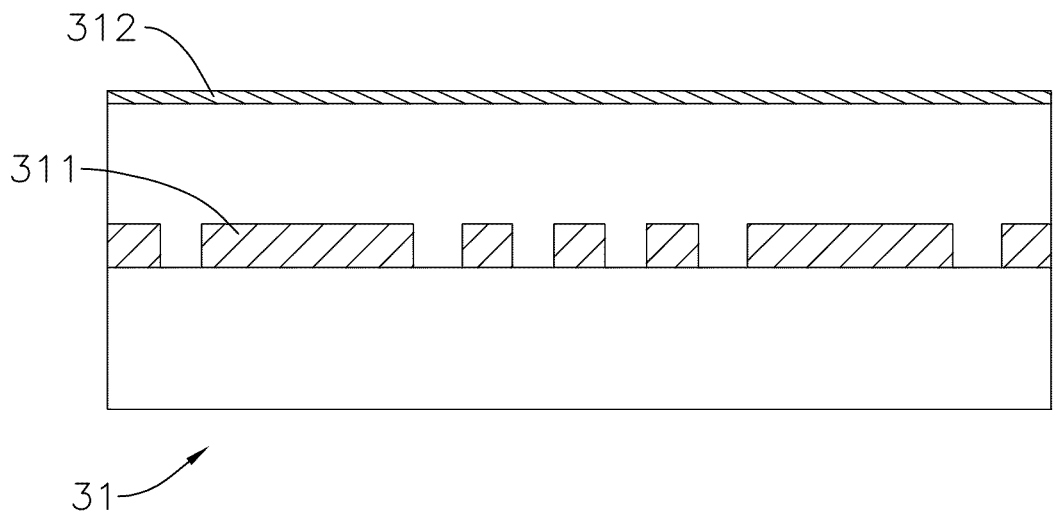
FIG. 3A to FIG. 3G are the schematic flowchart of the conventional circuit board structure.
Figure 3B:
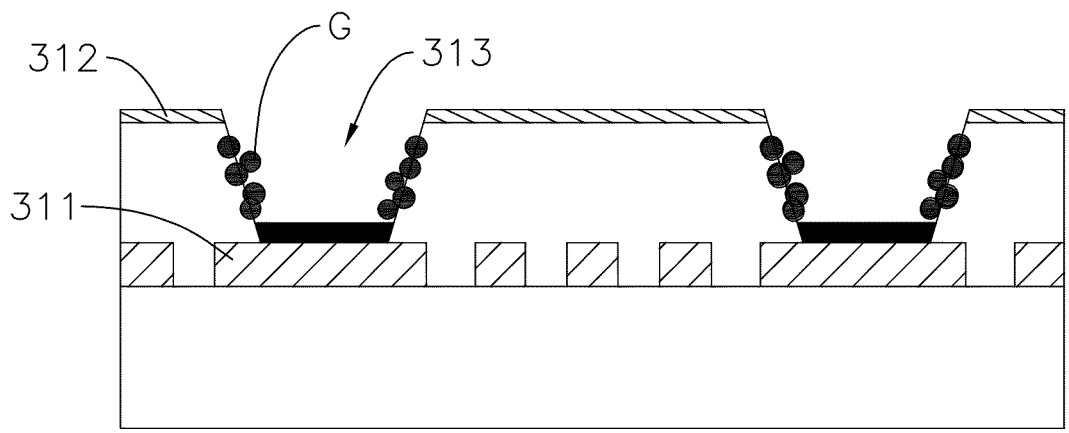
Figure 3C:
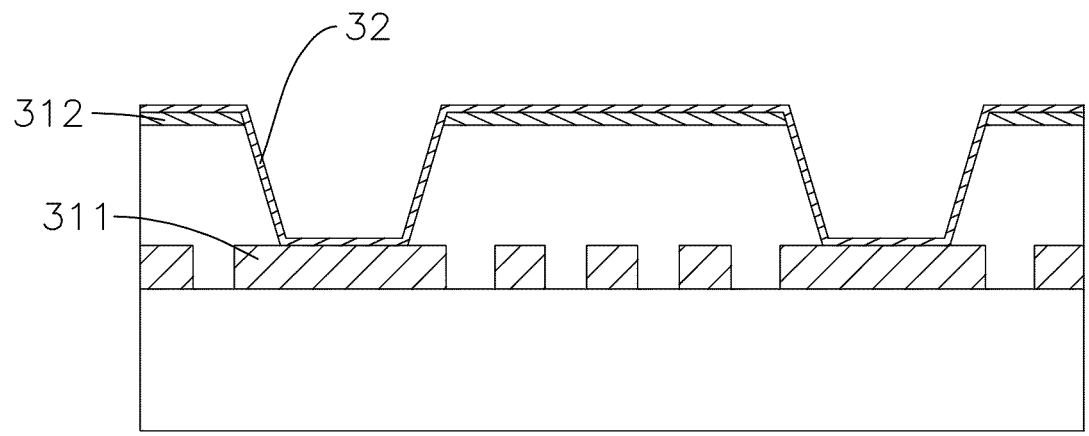
Figure 3D:
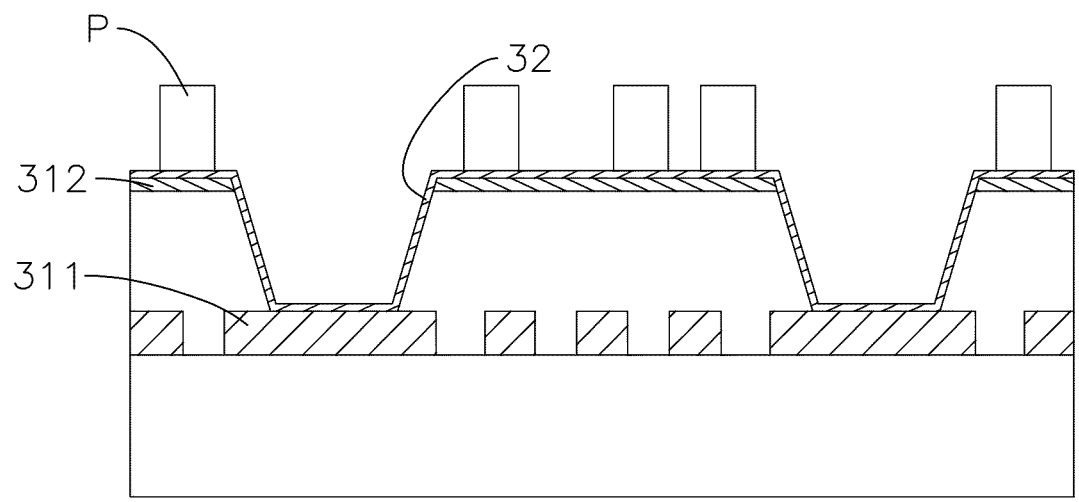
Figure 3E:
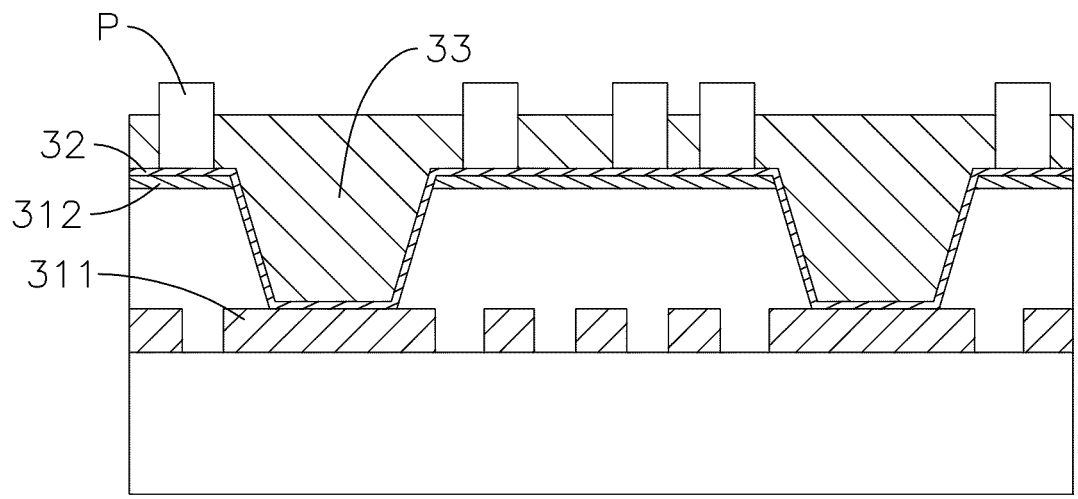
Figure 3F:
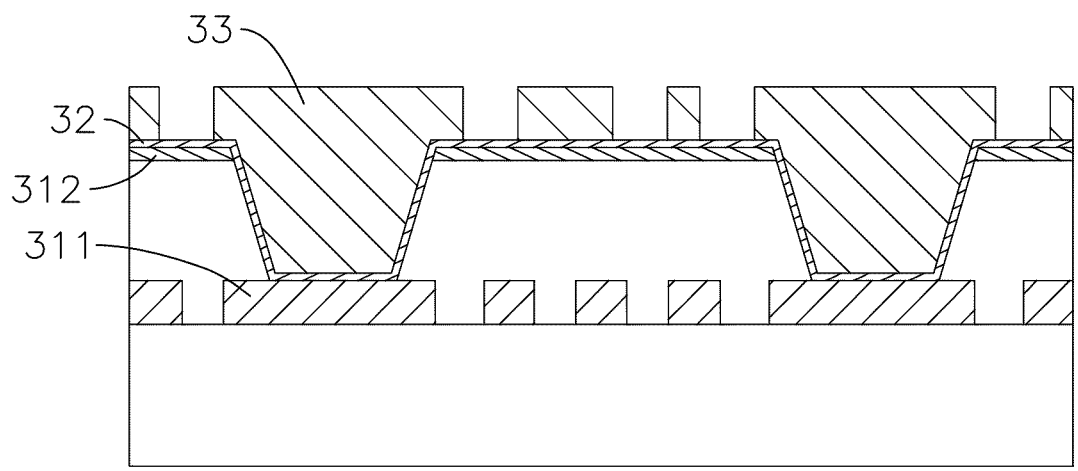
Figure 3G:
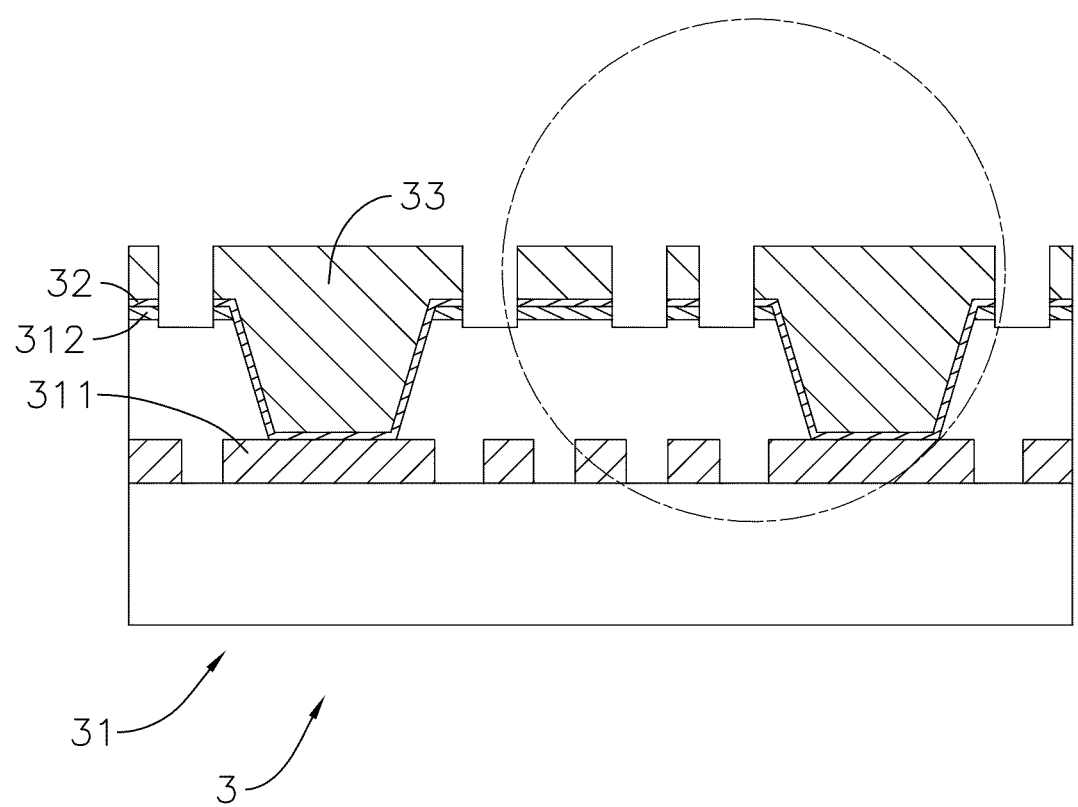
Figure 3H:
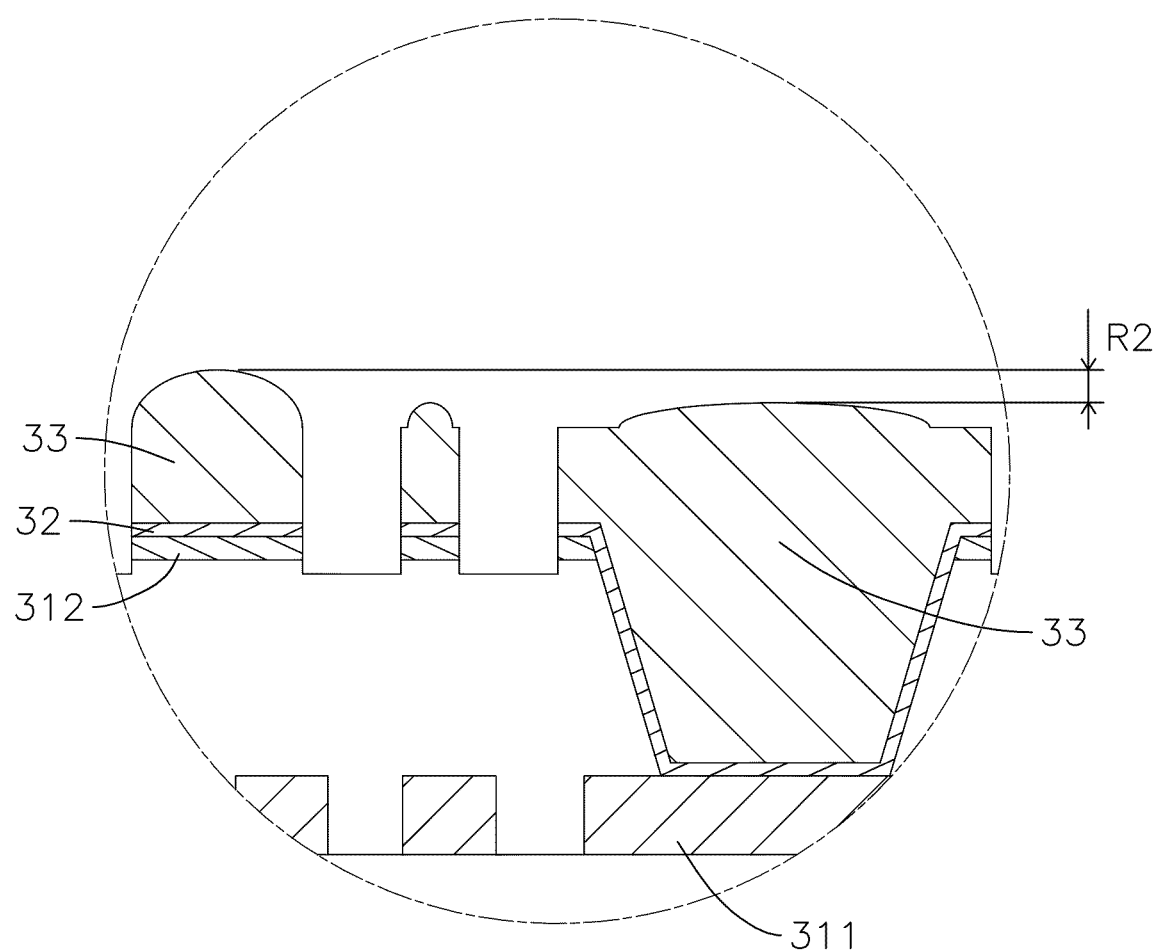
FIG. 3H is the partial enlargement view of the conventional circuit board structure.

Refer to FIG. 2. FIG. 2 is the cross sectional view of the improving wire structure of the circuit board 1 of the present invention. The improving wire structure of the circuit board 1 comprises a multi-layer circuit board 11, a first conductive circuit 12, a first circuit layer 13, an adhesion promoter layer 14, a second conductive circuit 15, and a second circuit layer 16. The multi-layer circuit board 11 comprises an inner circuit 111 and at least one opening 113. The at least one opening 113 exposes the inner circuit 111. The first conductive circuit 12 is disposed in the at least one opening 113 and on the inner circuit 111. The first circuit layer 13 is disposed on the first conductive circuit 12 in the at least one opening 113 and the height of the first circuit layer 13 is lower than the depth of the at least one opening 113. The adhesion promoter layer 14 is disposed in the at least one opening 113 and on the surface of the multi-layer circuit board 11 and connected to the first conductive circuit 12. The second conductive circuit 15 is disposed on the adhesion promoter layer 14 and on the first circuit layer 13 in the at least one opening 113. The second circuit layer 16 is disposed on the second conductive circuit 15 in the at least one opening 113 and on the second conductive circuit 15 on the multi-layer circuit board 11. The second circuit layer 16 comprises a plurality of circuits. A height difference between the plurality of circuits of the second circuit layer 16 protruding a surface of the at least one opening 113 is less than a first preset value. A circuit disposition range between the plurality of circuits of the second circuit layer 16 on the surface of the multi-layer circuit board 11 is less than a second preset value.

In an embodiment of the present invention, the thickness of the first conductive circuit 12 and the thickness the second conductive circuit 15 are less than and equal to 0.85 μm, that is, the copper thickness on the surface of the improving wire structure of the circuit board 1 is less than and equal to 0.85 μm.

In an embodiment of the present invention, the height difference between the plurality of circuits of the second circuit layer 16 protruding the surface of the at least one opening 113 is less than the first preset value, 2 μm. The circuit disposition range between the plurality of circuits of the second circuit layer 16 on the surface of the multi-layer circuit board 11 is less than the second preset value, 3.5 μm.

In summary, the method of improving the wire structure of the circuit board and the improving wire structure of the circuit board of the present invention utilize the circuit to be filled in the opening in two stages to complete the height of the circuit in the opening, wherein the method comprises the first stage for forming the first circuit layer utilizing the chemical copper mixed by solution with the excellent capability for copper electroplating to fill the opening, and the second stage for forming the second conductive circuit by disposing the chemical copper mixed by the solution with excellent homogeneity on the first circuit layer in the opening to complete the height of the circuit in the opening. Accordingly, the present invention achieves the effects that the height difference between the plurality of circuits protruding the at least one opening is less than the first preset value, 2 μm, and the circuit disposition range between the plurality of circuits on the surface of the multi-layer circuit board is less than the second preset value, 3.5 μm. Consequently, the homogeneity of the circuit layer can be promoted, the density of the circuit board can be increased and the reliability of the circuit layer can be improved. Besides, the method of improving a wire structure of a circuit board achieves the effect that the thickness of copper formed on the surface of the improving wire structure of the circuit board is less than and equal to 0.85 m. Therefore, the development for the fine circuit of the improving wire structure of the circuit board can be promoted. In addition, by the adhesion promoter layer disposed on the bottom material (the multi-layer circuit board) and in the opening, the bonding strength and the attachment ability between the second circuit layer, the bottom material, and the opening can be enhanced. Hence, the improving wire structure of the circuit board can be applied on the 5G product with low roughness in the future and the transmission rate of the 5G product can be significantly upgraded.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. An improving wire structure of a circuit board, comprising:
    a multi-layer circuit board, comprising an inner circuit and at least one opening; wherein the at least one opening exposes a part of the inner circuit;
    a first circuit layer, disposed in the at least one opening, and a height of the first circuit layer being lower than a depth of the at least one opening;
    a second circuit layer, disposed on the first circuit layer in the at least one opening and on a surface of the multi-layer circuit board;
    a first conductive circuit, disposed in the at least one opening and on a surface of the inner circuit; wherein the first circuit layer is disposed on the first conductive circuit; and
    an adhesion promoter layer, disposed in the at least one opening and on the surface of the multi-layer circuit board, and connected to the first conductive circuit;
    wherein the second circuit layer comprises a plurality of circuits.

2. The improving wire structure of the circuit board as claimed in claim 1, further comprising a second conductive circuit, disposed between the adhesion promoter layer and the second circuit layer and disposed between the first circuit layer and the second circuit layer.

* * * * *